United States Patent [19]

Lemmer

[11] Patent Number: 4,635,794

[45] Date of Patent: Jan. 13, 1987

[54] IC ROD-MAGAZINE

[76] Inventor: Alfred Lemmer, Machtlfingerstrasse 24, D-8000 München 70, Fed. Rep. of Germany

[21] Appl. No.: 631,627

[22] Filed: Jul. 17, 1984

[30] Foreign Application Priority Data

| Jul. 27, 1983 [DE] | Fed. Rep. of Germany | 8321507 |
| Sep. 15, 1983 [DE] | Fed. Rep. of Germany | 3333374 |
| Oct. 11, 1983 [DE] | Fed. Rep. of Germany | 3336986 |
| Jun. 1, 1984 [EP] | European Pat. Off. | 84106297.9 |

[51] Int. Cl.$^4$ ................ B65D 73/02; B65D 83/00; B65D 85/30
[52] U.S. Cl. ............................. 206/328; 206/332; 206/334; 206/340
[58] Field of Search .............. 206/328, 332, 334, 340; 221/310, 307

[56] References Cited

U.S. PATENT DOCUMENTS

| 372,045 | 10/1887 | Smith, Jr. | 221/307 |
| 2,747,768 | 5/1956 | Raines | 221/310 |
| 3,206,067 | 9/1965 | Smith, Jr. et al. | 221/310 |
| 3,278,107 | 10/1966 | Rygg | 206/340 |
| 3,435,949 | 4/1969 | Suverkropp | 206/332 |
| 4,172,523 | 10/1979 | Weglage | 221/307 |
| 4,353,481 | 10/1982 | Tando | 221/307 |
| 4,515,269 | 5/1985 | Hashimoto | 206/328 |
| 4,533,043 | 8/1985 | Swain | 206/340 |
| 4,553,190 | 11/1985 | Mueller | 206/328 |

FOREIGN PATENT DOCUMENTS

| 2030544 | 4/1980 | United Kingdom | 206/328 |
| 2121764 | 1/1984 | United Kingdom | 206/328 |

Primary Examiner—William Price
Assistant Examiner—Brenda J. Ehrhardt
Attorney, Agent, or Firm—Fitzpatrick, Cella, Harper & Scinto

[57] ABSTRACT

A magazine for IC's, in which the invention is carried out by the use of a deflectable spring element which is arranged at the end of the IC rod-magazine, and which, in its undeflected position, closes the opening of the magazine chamber at least to such an extent that IC's, contained in the magazine chamber, are blocked at the opening, and which, when it has deflected against spring tension, allows IC's to come out.

25 Claims, 15 Drawing Figures

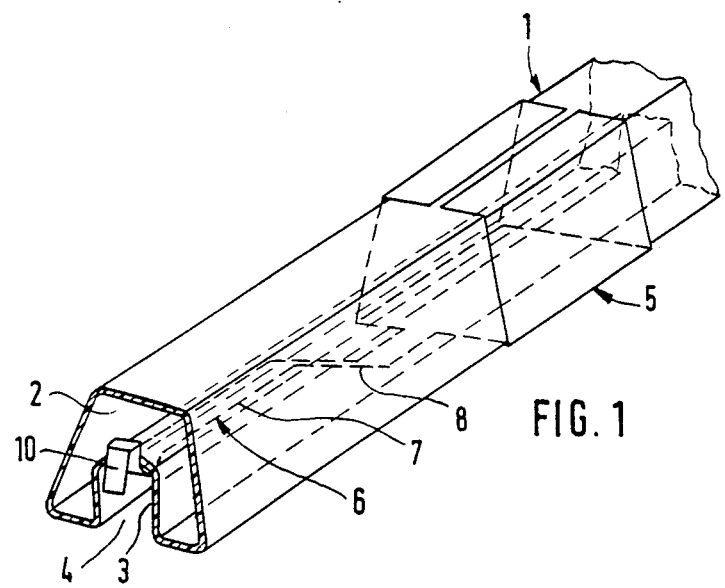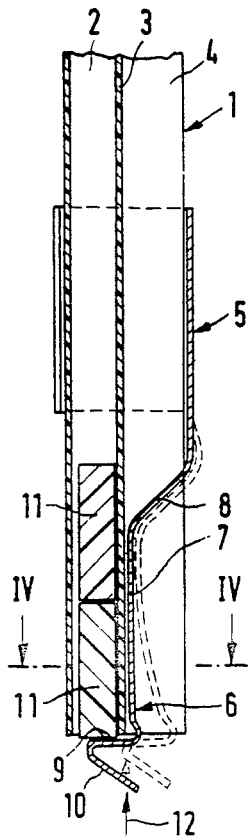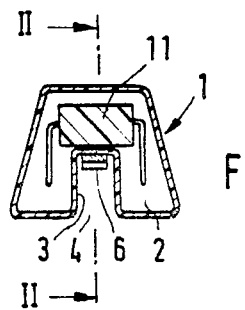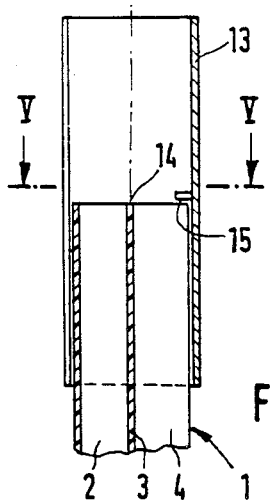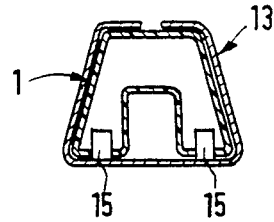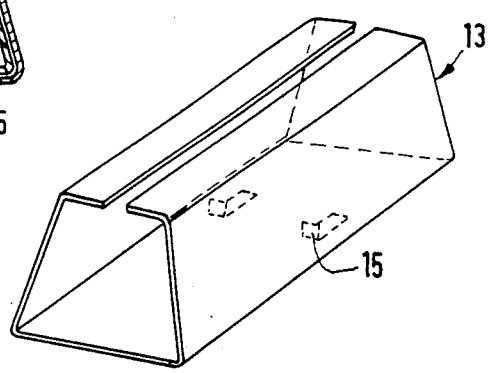

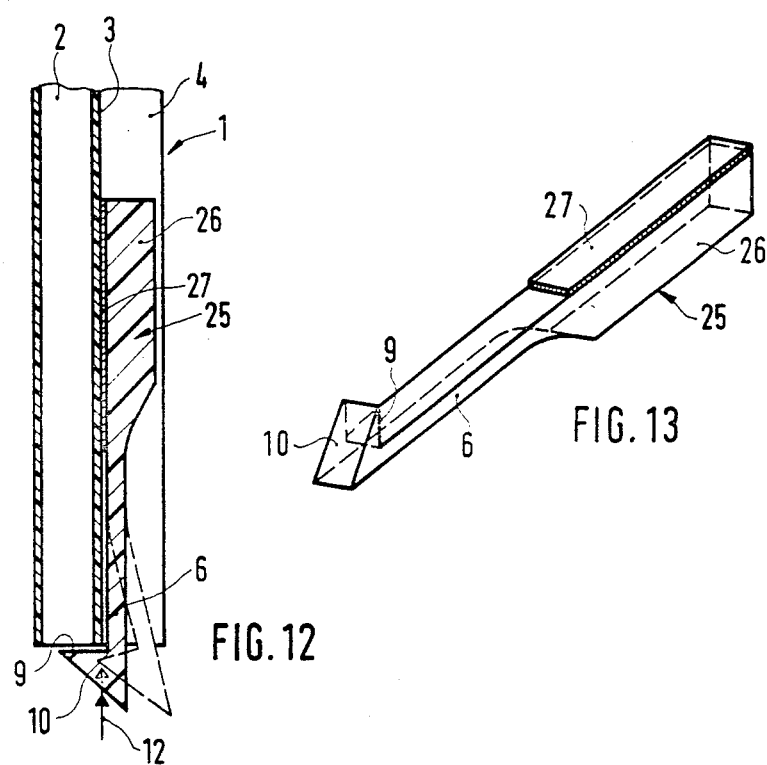

IC ROD-MAGAZINE

TECHNICAL FIELD OF INVENTION

The invention relates to an IC rod-magazine, more particularly to such a magazine whose magazine chamber has a substantially U-shaped profile as a result of an inwardly directed wall protrusion.

BRIEF DESCRIPTION OF THE PRIOR ART

Integrated circuits or IC's, as they are called in the shortened form, are as a rule stored and transported in rod-magazines. The rod-magazines are, for example, tubes which are approximately 50 cm long, which are made of transparent, antistatic synthetic material and the chamber of which has a substantially U-shaped profile. The IC bodies lie in tandem between the wall protrusion and the wall of the rod-magazine opposite the said protrusion; the connecting legs of the IC's project into those areas of the chamber which form the sides of the U-shaped profile of the chamber. Rod-magazines having a corresponding and differing profile cross-section exist for different types of integrated circuits.

Up to now, either rubber stoppers or sealing pins extending cross-wise through the magazine chamber have been used to seal the rod-magazines. If one IC or several IC's are to be taken out of the rod-magazine, the rubber stopper or the sealing pin must be removed at one end of the rod-magazine and the rod-magazine must then be tilted so that the desired number of IC's slides out. The open end of the rod-magazine is then kept shut with one finger and the rubber stopper or the sealing pin is inserted again. This method is particularly troublesome and difficult if the rod-magazine is, for example, to be placed upon an IC utilization apparatus, on, for example, an assembly table for printed circuit boards. The rod-magazine must then be kept closed with the finger until immediately before insertion on the IC utilization apparatus. Shortly before insertion, however, the finger performing the closing action must then be taken from the opening due to lack of space and as a result there is a danger that IC's will unintentionally slide out of the rod-magazine beforehand.

SUMMARY OF THE INVENTION

This invention is carried out by the use of a deflectable spring element which is arranged at the end of the IC rod-magazine, and which, in its undeflected position, closes the opening of the magazine chamber at least to such an extent that the IC's, contained in the magazine chamber, are blocked at the opening, and which, when it has been deflected against the spring tension, allows IC's to come out.

The arrangement according to the invention makes it possible, in, on the one hand, a simple manner and in, on the other hand, a reliable manner and also in a manner which is comfortable in terms of operation, to close the IC rod-magazine. This closure can be removed merely through deflection of the spring element, so that any number of IC's can be taken out easily, and is reintroduced automatically after release of the spring element, so that IC's are prevented from falling out.

The spring element can also be deflected out of its closed position by means of mechanical deflecting elements upon insertion into, for example an IC utilization apparatus. It is crucial that the spring element automatically goes back into the closed position at that point when no more deflecting force is exerted on the said spring element. In this way, a situation where IC's unintentionally slide out of the rod-magazine is avoided with certainty.

One embodiment of the invention relates to forming the spring element, preferably in one piece, on the IC rod-magazine. In this way, the production can be simplified without the need for an additional structural member.

An advantageous development of the invention may lie in the fact that the spring element has an area which is oblique in respect of the longitudinal direction of the rod-magazine and which causes the spring element to deflect when this area is pressed in the longitudinal direction of the rod-magazine against a deflection stop or when the deflection stop is pressed against the oblique area. In this case, the longitudinal displacement, which results any way when pushing a rod-magazine into an IC utilization apparatus, in conjunction with an oblique plane or wedge surface is thus turned to account.

The oblique area ought preferably to cut the imaginary prolongation of the highest point of the wall protrusion, which prolongation extends in the longitudinal direction of the rod-magazine. This is because, as a rule, the joining piece in the IC utilization apparatus or a further rod-magazine, with which the first-named rod-magazine is to be connected, have the same profile cross-section as the first-named rod-magazine, in which case the highest point of the wall protrusion of the joining piece or of the additional magazine acts as a deflection stop for the spring element.

According to one development, the spring element is a separate, additional structural member having a shaft portion which may be fixed on the rod-magazine in a form-locking or force-locking manner and which is, therefore, easy to install or to remove.

An advantageous arrangement of the invention may lie, furthermore, in the fact that the spring element is constructed as a spring tongue which extends in the longitudinal direction of the rod-magazine through the channel, which is formed by the wall protrusion, towards the end of the rod-magazine and which has a portion there which has been bent up and which is directed towards the opening of the magazine chamber. Through this measure, it is guaranteed that the spring excursion of the spring tongue is essentially within the channel mentioned and that an external alteration in the joining piece practically does not occur upon deflection of the spring tongue.

The oblique area is preferably joined to the end of that portion of the spring tongue which has been bent up when constructing the closing piece as a case with spring tongue.

One advantageous possibility for fixing the spring element consists in constructing the shaft portion in the form of a case or sleeve and in sliding it onto the rod-magazine.

The case can be formed in such a way that it bridges the channel, which is formed by the wall protrusion, in which case the spring tongue extends, starting from the case, in an at least partially oblique manner in respect of the longitudinal direction of the magazine through the channel, towards the end of the rod-magazine and there in the undeflected state rests against the bottom of the channel.

The case and/or the spring element may more particularly be constructed in one piece and are preferably made of metal. As an alternative to this, it is possible to injection-mould the case out of synthetic material and to produce the spring element out of metal and to secure the latter to the case. A development of the last-named alternative may lie in the fact that the case, which is injection-moulded out of synthetic material, has a socket channel for the spring tongue, which channel extends in the longitudinal direction of the rod-magazine. The socket channel may be provided with a recess which is open towards the interior space of the case, in which case that portion of the spring tongue which may be inserted into the socket channel is provided with a portion which has been bent outwards in a wave-like manner and which engages into the recess when the spring tongue is pushed into the socket channel.

The construction of the spring element, consisting of case and spring tongue, has, in addition, the added advantage that it allows the spring tongue to be arrested in the open position when the case is pushed back from the opening with the spring tongue. This can take place, for example, when the rod-magazine is to be kept permanently open, at least for a certain length of time.

An advantageous fixing place for the spring element is the free space, which is formed by the U-shaped wall protrusion and which makes it possible for at least all of the shaft portion to be accommodated. It is possible to glue the spring element therein. The spring element may then consist of a plastic piece having a thicker supporting body and a thinner tongue element which is connected with the latter in one piece. The supporting body may be provided with a coating of adhesive on its relevant side for the purpose of effecting the glued connection more simply.

An advantageous possibility for securing the spring element consists in holding it with lateral projections on the shaft portion or on the spring tongue in recesses which are arranged in the opposite side walls of the wall protrusion. A fixed arrangement of this kind may be installed or dismantled easily because the bar-shaped sections of the rod-magazine can be bent apart comparatively easily for the purpose of inserting the projections into or taking the projections out of the recesses, whereupon they return elastically to their starting position and fix the spring element. When the recesses continue into the walls, which are connected to the wall protrusion in the peripheral direction, the recesses may be easily worked into from above; they may, for example, be milled.

Another development of the IC rod-magazine, to which separate, inventive importance is attached, may lie in the fact that belonging to the IC rod-magazine there is, in addition, an IC separating plug-in portion which—viewed from the end of the rod-magazine—may be slid onto the end section of the rod-magazine before the shaft portion or the case and projects over the end of the rod-magazine, that the separating plug-in portion has an extraction opening which is lateral with regard to the longitudinal direction of the rod-magazine and the length of which being measured in the longitudinal direction of the rod-magazine, is equal to or somewhat greater than the length of the IC's contained in the rod-magazine, that the separating plug-in portion has at the end of the extraction opening a stop for the IC's and that a deflecting element for the spring element, which deflecting element may be operated by hand, is provided on the separating plug-in portion. For the practical development of this separating plug-in portion, it is proposed that it have substantially the same cross-sectional shape as and merely slightly greater dimensions than the rod-magazine so that it can encompass the latter's end section with press fit, that the section of the separating plug-in portion, which section projects over the end of the rod-magazine, have a wall recess which forms the extraction opening and which is found substantially above the highest point of the inwardly directed wall protrusion, that a closing wall, which forms the stop for the IC's, be found at the end of the separating plug-in portion and that a through hole for the spring element be provided in the wall protrusion of the separating plug-in portion.

The deflecting element may, for example, be formed by a wire strap which extends in a rotatable manner cross-wise through the separating plug-in portion and which has a portion, which has been bent outwards and which extends between the oblique area of the spring element and the bottom of the channel, in the channel which is formed by the wall protrusion.

The separating plug-in portion may be made of sheet metal or synthetic material. It may, more particularly, be constructed in one piece with the case which carries the spring element or else it may be a part which is separate from the case mentioned.

Another development of the closing piece, to which separate, inventive importance is likewise attached, may lie in the fact that belonging to the closing piece there is a connecting sleeve for the purpose of connecting the end section of the rod-magazine with an end section of a second rod-magazine or for the purpose of slipping the rod-magazine onto a take-over joining piece which has the same cross-section as the rod-magazine, in which case the highest point of the wall protrusion forms the deflection stop for the spring element at the end of the second rod-magazine or at the end of the take-over end piece. The connecting sleeve may be made of synthetic material or of sheet metal. More particularly, it is possible for the connecting sleeve and the case, which carries the spring element, to be constructed in one piece. They may, however, also be separate parts.

BRIEF DESCRIPTION OF THE DRAWINGS

Exemplary embodiments of the invention are described in the following with the aid of the drawings, in which:

FIG. 1 shows a perspective representation of an end section of an IC magazine with closing piece, consisting of case and spring tongue;

FIG. 2 shows a longitudinal section through the end section in FIG. 1 and also shows a section II—II through FIG. 4;

FIG. 3 shows a longitudinal section through an end section of a further IC magazine having connecting sleeve which has been slid thereon;

FIG. 4 shows a section IV—IV through FIG. 2;

FIG. 5 shows a section V—V through FIG. 3;

FIG. 6 shows a perspective representation of the connecting sleeve which is shown in FIGS. 3 and 5;

FIG. 12 shows a longitudinal section through the end section of an IC magazine with another embodiment of the closing piece;

FIG. 13 shows a perspective representation of the closing piece according to FIG. 12;

DETAILED DESCRIPTION OF THE PREFERRED EMBODIMENT OF THE INVENTION

Figure 7:
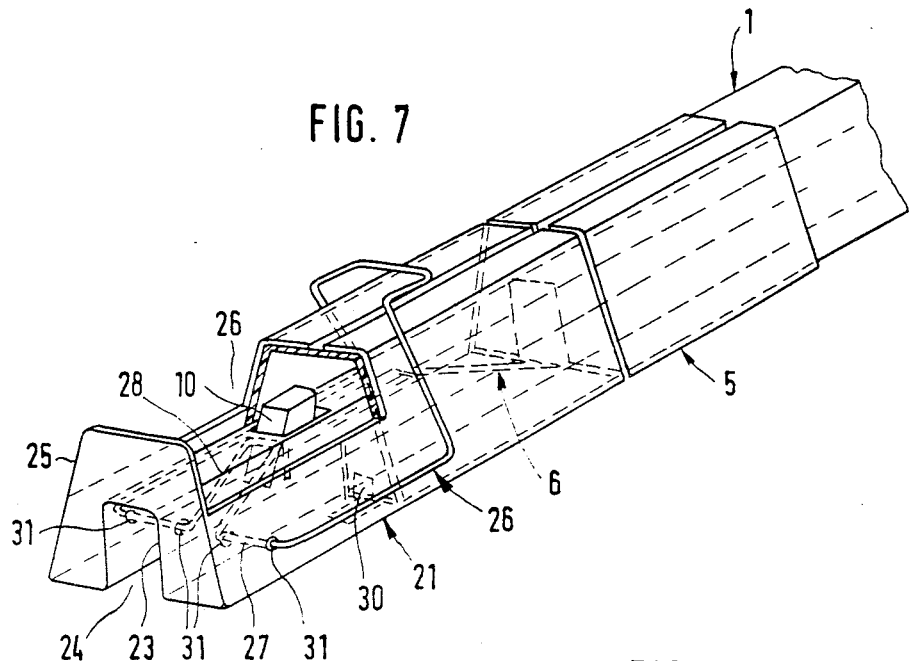
FIG. 7 shows a perspective representation of an end section of an IC magazine, consisting of case and spring tongue, as in FIG. 1, but in this case having, in addition, the separating plug-in portion which has been slid thereon.

The IC rod-magazine 1, which is shown in FIG. 1, is made of transparent, antistatic synthetic material. As a result of a wall protrusion 3, the magazine chamber 2 has a substantially U-shaped profile. The wall protrusion 3 forms a channel 4 which may be reached from the outside. A metal sleeve 5, which bridges the channel 4, is slid onto the illustrated end section of the IC rod-magazine 1. The sleeve is slit in the longitudinal direction so that it encompasses the IC rod-magazine in a springy manner. A spring tongue 6 is located on that side of the sleeve 5 which bridges the channel 4. This tongue has a section 8, which extends in an oblique manner in respect of the longitudinal direction of the rod-magazine, and a straight section 7 which extends, when in the state of non-deflection, parallel to the longitudinal direction of the rod-magazine. The straight section 7 has at the end of the rod-magazine 1 a bent or flexure portion 9 which blocks the exit of the IC's 11, which are contained in the rod-magazine, when the spring tongue 6 is in the state of non-deflection. An oblique region 10 is situated, furthermore, on the bent portion 9.

The spring tongue 6 may be deflected by hand or through a corresponding counterblow. The position of deflection is indicated by means of broken lines. In the possition of deflection, the IC's can slide out of the magazine chamber 2.

The end section of a further rod-magazine 1, onto which a connecting sleeve 13 is slid, is shown in FIG. 3. When the two magazines 1, which are shown in FIGS. 2 and 3, are pushed together in such a way that the upper portion of the connecting sleeve 13 encompasses the free portion of the end section of the upper magazine 1, the highest point of the wall protrusion 3 of the lower magazine 1 acts as a stop (see arrow 12) which shifts the oblique area 10 of the spring tongue 6 to the right into the open position shown by the broken lines. In this way, the IC's 11 can slide from the upper rod-magazine 1 into the lower rod-magazine 1.

The connecting sleeve is represented in more precise detail in FIGS. 5 and 6. It is seen that the connecting sleeve is also slit at the top in the longitudinal direction of the magazine and in this way can also encompass the rod-magazines 1, which are to be connected, in a springy manner. On the bottom of the connecting sleeve 13, which is preferably made of sheet metal, there are bent outwards stops 15 for the rod-magazines 1.

FIG. 4 shows in section how the IC's 11 are arranged in the rod-magazine 1. The IC bodies rest as a result upon the highest point of the wall protrusion 3. The connecting legs of the IC's project into those areas of the chamber which form the U-shaped sides of the magazine chamber 2.

Figure 8:
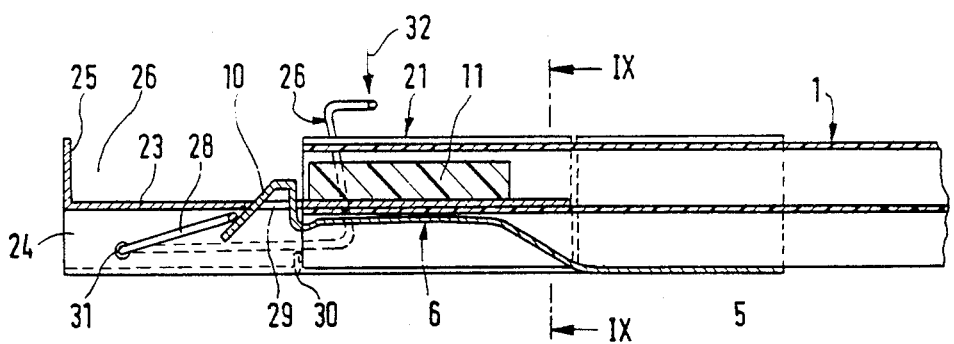
FIG. 8 shows a longitudinal section through FIG. 7.
Figure 9:
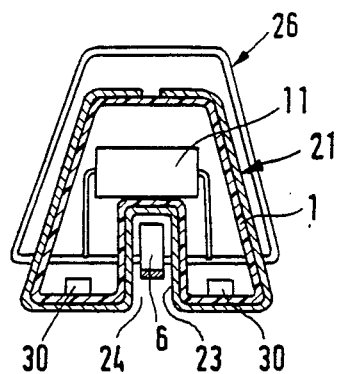
FIG. 9 shows a section IX—IX through FIG. 8.

FIGS. 7, 8 and 9 show the end section of the rod-magazine 1, which section is represented in FIG. 1, with, in addition, a separating plug-in portion 21. This has a profile which is similar to that of the sleeve 5 and is also slit at the top. It may be constructed in one piece with the sleeve or it may be separate from the latter—as represented. The separating plug-in portion 21 has an extraction opening 33, the length of which is substantially equal to or somewhat greater than that of the IC's 11 in the rod-magazine 1. At the end, the separating plug-in portion 21 has a wall 25 which forms a stop for the IC's which are emerging from the magazine 1.

Unlike the sleeve or case 5, but like the magazine 1, the separating plug-in portion 21 is provided with a wall protrusion 23 which forms a channel 24 which may be reached from the outside. The spring tongue 5 extends through this cannel 24. The portion of the spring tongue which is bent over and also the oblique area 10 dip through an opening 29 which is found near the end of the rod-magazine 1 at the highest point of the wall protrusion 23.

In order to bring the spring tongue 6 into the open position, a wire strap 26 is provided. This extends through holes 31 in the wall portions of the separating plug-in portion 26 and has a bent-out portion 28 which extends between the oblique area 10 of the spring tongue 6 and the highest point of the wall protrusion 23. If pressure is exerted from above upon the wire strap according to arrow 32, the wire strap is turned about the point of rotation in the holes 31. The bent-out portion 28 is turned therewith and causes the spring tongue 6 to deflect downwards. The last IC 11 can then slide onto the free ridge of the wall protrusion 23 and be removed therefrom. Upon release of the wire strap 26, the spring tongue 6 lifts the IC, which has emerged, a little, whereby removal is facilitated. On the bottom of the separating plug-in portion there are further stop portions 30, which have been bent outwards and which are similar to those stop portions 15, which have been bent outwards, in FIG. 6 on the connecting sleeve 13, for the rod-magazine 1.

Figure 10:
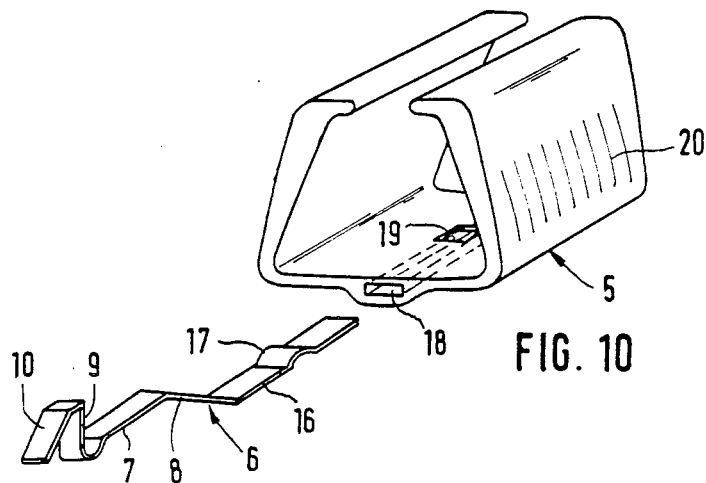
FIG. 10 shows another embodiment for the closing piece.
Figure 11:
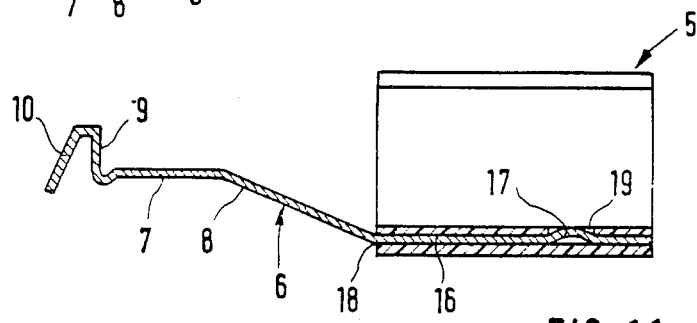
FIG. 11 shows a longitudinal section through FIG. 10.

Another alternative embodiment of the sleeve or case with a spring tongue is shown in FIGS. 10 and 11. The case 5 consists, in this embodiment, of a plastic moulded part which is provided with a socket channel 18 for the spring tongue 6 which is made of metal. The latter has a straight section 16 which has a portion 17 which has been bent outwards in a wave-like manner. This section engages into an opening 19 of the socket channel 18, which opening is directed towards the interior space of the case 5. It is still to be mentioned that the connecting sleeve 13, which is shown in FIG. 6, can also be constructed in one piece with the case 5. It is self-evident that the materials must then be chosen accordingly.

FIG. 12 shows another embodiment of the closing piece which is here designated 25. This closing piece is represented perspectively again in FIG. 13. The closing piece 25, which is made of synthetic material, has a thicker supporting body 26 and a thinner tongue element 6 which is moulded onto the supporting body 26 in one piece. At the end of the tongue element 6 there is provided a bevelled portion 9 which closes the opening of the measuring chamber when in the state of non-deflection. The state of deflection is represented in broken lines. It is seen that the opening of the measuring chamber is, in this case, unblocked. The projection 9 is provided with an area 10 which extends obliquely in respect of the longitudinal direction of the magazine 1. If this oblique area 10 butts against a stop, which is indicated by means of the arrow 12, the tongue element 6 is deflected and unblocks the opening of the measuring chamber.

The thicker supporting body 26 is provided with a coating of adhesive 27 on that side to which the bevelled portion 9 extends. The closing piece 25 is glued on the bottom of the channel 4 which is formed by means of the U-shaped wall protrusion of the IC magazine 1, by means of this coating of adhesive 27.

The closing piece 25 in FIGS. 12 and 13 has the advantage over the closing piece 5 in FIGS. 1 and 2 in so far as it does not increase the size of the IC rod-magazine 1. This is particularly important when the IC rod-magazine is, for example, inserted into an adapter which has a feed hole which is adapted to the size of the IC magazine.

Figure 14:
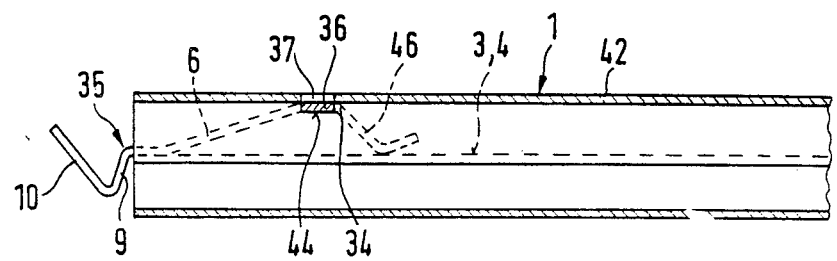
FIG. 14 shows a further embodiment of an IC magazine in a section along the line XIV—XIV in FIG. 15.
Figure 15:
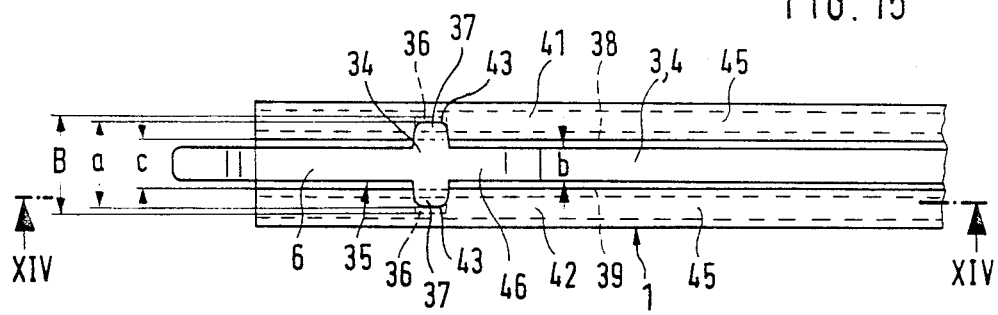
FIG. 15 shows a side view of the IC magazine according to FIG. 14.

In the cases of the embodiment according to FIGS. 14 and 15, the closing element, which in this case is designated 35, is likewise placed in the channel 4, which is formed by the U-shaped wall protrusion 3 and is secured therein. The closing element 35 has on a shaft portion 34 lateral projections 36, which lie opposite each other, which are tapered trapezoidally and which plug into recesses 37 which are incorporated in the side walls 38, 39 of the wall protrusion 3, which walls lie opposite each other. The recesses 37 continue in the walls 41, 42 which are connected to the wall protrusion 3 in the peripheral direction. As a result of this arrangement, the recesses 37 are open not only towards the wall protrusion 3, but also towards the relevant outer side of the rod-magazine 1. This arrangement makes it possible, in a simple manner, to produce the recesses 37 by means of a milling cutter, for example, an end-milling cutter, the longitudinal axis of which is directed radially in respect of the longitudinal axis of the rod-magazine 1. When the recesses 37 are produced in the manner described above with a rotating, cutting tool, their edges 43, which are remote from each other, are rounded off. The lateral projections 36 grip these edges slightly from below, as may be seen clearly in FIG. 15. That is why the lateral projections 36 are held between the walls 41, 42 and the inner longitudinal edges of the recesses 37, which edges are denoted with 44. For the purpose of securing against torsion in the fixed position, it is recommended that the cross-sectional shape of the recesses 37 be adapted to the cross-sectional shape of the projections 36 so that the projections 36 are accommodated in the recesses 37 in a manner which is secure in respect of torsion.

For the purposes of installing or dismounting the closing piece 35, it is merely necessary to press the bars of the U-shaped profile of the rod-magazine 1 apart, the said bars being denoted with 45, that is, to press them apart to such an extent that the projections 36 no longer grip the edges 43 from below. As soon as the projections 36 are free, the closing piece 35 may be removed. When installing the closing piece 35 the procedure is reversed accordingly.

For the purpose of stabilizng the closing piece 35, the latter has at its end, which is remote from the spring tongue 6, a supporting side 46 which extends as far as the bottom of the wall protrusion 3. As the spring tongue 6 also extends obliquely to the bottom of the wall protrusion 3 and rests against the bottom of the wall protrusion 3 before the bent-up portion 9, the closing piece 35 is accommodated in the recesses 37 in a manner which is secure in respect of torsion. The aforementioned measures constitute an additional measure for the form-locking engagement of the projections 36 in the recesses 37, which measure per se already represents a guarantee against torsion.

The closing piece 35 is guided laterally because those portions of the closing piece 35 which lie at the bottom of the wall protrusion 3, are dimensioned so that they are substantially as wide (b) as the base of the wall protrusion 3, as may be seen in FIG. 15 by means of light edges which extend in a longitudinal manner. The width, which is measured between the tips of the projections 36, is denoted with B in FIG. 15. This width B is clearly greater than the width c in the outer region of the channel 4 and is even slightly greater than the distance a, this being the distance between the edges 43.

The closing piece 35 is punched out of plate spring steel in one piece. After punching, the supporting side 46, the oblique course of the spring tongue 6, the bent or flexure portion 9, and the oblique area 10 at the tip of the spring tongue 6 are formed thereon through bending.

What is claimed is:

1. An IC rod-magazine comprising an elongated tubular member having an inwardly directed wall protrusion and forming a magazine chamber having a substantially U-shaped interior cross-section, a deflectable spring element having one end mounted on said tubular member and a formation on the other end of said spring element, said formation including a wall section which, in the undeflected position of said spring element, extends across an opening at one end of said magazine chamber to block movement of IC elements from said chamber and in the deflected position of said spring element uncovers said opening to allow exit of IC elements from said chamber, said formation having a further wall section for receiving an externally applied force and causing deflection of said spring element, said spring element being a spring tongue which extends in the longitudinal direction of the rod-magazine through a channel formed by the wall protrusion towards said one end of the rod-magazine, said wall section of said formation comprising a bent-up portion of said spring which is directed towards the opening at said one end of the magazine chamber, said further wall section of said formation being formed on said spring adjacent said bent-up portion, said further wall section being oblique in the direction facing away from said one end of said rod-magazine and in respect of the longitudinal direction of said rod-magazine and cutting the imaginary prolongation of the highest point of the wall protrusion in the undeflected position of said spring tongue so that when pressure is applied between said further wall section and a deflection stop in the longitudinal direction of the magazine, the spring element is caused to deflect.

2. An IC rod-magazine according to claim 1, wherein the spring element has a shaft portion fixed on the rod-magazine.

3. An IC rod-magazine according to claim 2, wherein the shaft portion comprises a case which is slid onto an end section of said elongated tubular member and which, at least partially, encompasses the said section.

4. An IC rod-magazine according to claim 3, wherein the case and the spring element are constructed in one piece and are made of metal.

5. An IC rod-magazine according to claim 3, wherein the case is injection-moulded synthetic material and wherein the spring element is metal and is secured to the case.

6. An IC rod-magazine according to claim 3, wherein the case is injectionmoulded synthetic material and is formed with a socket channel which holds the spring tongue, said channel extending in the longitudinal direction of the rod-magazine.

7. An IC rod-magazine according to claim 6, wherein the socket channel is formed with a recess which opens towards the interior of the case and the portion of the spring tongue inserted into the socket channel is bent outwards in a wave-like manner to engage the recess.

8. An IC rod-magazine according to claim 1, wherein the spring element extends into the channel formed by the U-shaped wall protrusion and is secured therein.

9. An IC rod-magazine according to claim 8, wherein the spring element is glued in the U-shaped wall protrusion.

10. An IC rod-magazine according to claim 1, further including an IC separating plug-in portion which is slideable at said elongated tubular member and extends out from one end thereof, said separating plug-in portion being formed with an extraction opening which extends laterally of the longitudial direction of the rod-magazine and the length of which, being measured in the longitudinal direction of the rod-magazine, is at least as great but no more than slightly greater than the length of the IC's contained in the rod-magazine, said separating plug-in portion including, at the end of its extraction opening, a stop for the IC's and further including a hand operated deflecting element for the spring element.

11. An IC rod-magazine according to claim 10, wherein the separating plug-in portion is made of sheet metal.

12. An IC rod-magazine according to claim 1, and including a connecting sleeve for the purpose of connecting the end section of the rod-magazine with an end section of a second rod-magazine or for the purpose of slipping the rod-magazine onto a take-over joining piece which has the same cross-section as the rod-magazine wherein said second rod-magazine and said take-over joining piece have a wall protrusion whose highest point forms a deflection stop for engaging said further wall section on said formation.

13. An IC rod-magazine according to claim 12, wherein the connecting sleeve is made of synthetic material.

14. An IC rod-magazine according to claim 12, wherein the spring element is mounted on a case which is fitted to an end section of said elongated tubular member and is constructed in one piece with said case.

15. An IC rod-magazine according to claim 13 wherein said separating plug-in portion has a tubular wall of substantially the same cross-sectional shape as, and is press fitted over said elongated tubular member, wherein said extraction opening is formed by a recess in said tubular wall substantially above the highest point of said inwardly directed wall protrusion and wherein a through hole is formed in a wall protrusion of said tubular wall corresponding to the wall protrusion of said tubular member through which said formation on the other end of said spring element projects.

16. An IC rod-magazine according to claim 10, wherein the separating plug-in portion is made of a synthetic material.

17. An IC rod-magazine according to claim 12, wherein the connecting sleeve is made of sheet metal.

18. An IC rod-magazine according to claim 12, wherein the spring element is mounted on a case which is fitted to an end section of said elongated tubular member and wherein said spring and case are constructed as separate members.

19. An IC rod-magazine comprising an elongated tubular member having an inwardly directed wall protrusion and forming a magazine chamber having a substantially U-shaped interior cross-section, a deflectable spring element having one end mounted on said tubular member and a formation on the other end of said spring element, said formation including a wall section which, in the undeflected position of said spring element, extends across an opening at one end of said magazine chamber to block movement of IC elements from said chamber and in the deflected position of said spring element uncovers said opening to allow exit of IC elements from said chamber, said formation having a further wall section for receiving an externally applied force and causing deflection of said spring element, said spring element having a shaft portion fixed on the rod-magazine, said shaft portion comprising a case which is slid onto an end section of said elongated tubular member and which, at least partially, encompasses the said section, said case bridging a channel formed by the wall protrusion, the spring tongue extending from the case, in an at least partly oblique manner in respect of the longitudinal direction of the rod-magazine, through the channel and towards the end of the rod-magazine, and there, in the non-deflected state, rests against the bottom of the channel.

20. An IC rod-magazine comprising an elongated tubular member having an inwardly directed wall protrusion and forming a magazine chamber having a substantially U-shaped interior cross-section, a deflectable spring element having one end mounted on said tubular member and a formation on the other end of said spring element, said formation including a wall section which, in the undeflected position of said spring element, extends across an opening at one end of said magazine chamber to block movement of IC elements from said chamber and in the deflected position of said spring element uncovers said opening to allow exit of IC elements from said chamber, said formation having a further wall section for receiving an externally applied force and causing deflection of said spring element, said spring element comprising a plastic piece having a thicker supporting body and a thinner tongue element connected to each other as one piece, said formation further comprising a bevelled portion at one end of the tongue element and facing towards the opening at one end of the magazine chamber.

21. An IC rod-magazine according to claim 20, wherein said supporting body is provided with a coating of adhesive.

22. An IC rod-magazine comprising an elongated tubular member having an inwardly directed wall protrusion and forming a magazine chamber having a substantially U-shaped interior cross-section, a deflectable spring element having one end mounted on said tubular member and a formation on the other end of said spring element, said formation including a wall section which, in the undeflected position of said spring element, extends across an opening at one end of said magazine chamber to block movement of IC elements from said chamber and in the deflected position of said spring element uncovers said opening to allow exit of IC elements from said chamber, said formation having a further wall section for receiving an externally applied force and causing deflection of said spring element, said spring element having a shaft portion fixed on the rod-magazine, opposite side walls of said wall protrusion being formed with recesses which lie opposite each other and the shaft portion of the spring element being formed with two lateral projections which are set into said recesses.

23. An IC rod-magazine according to claim 22, wherein said recesses extend into the walls which are connected to the wall protrusion in the peripheral direction and the edges of the recesses remote from one another, are rounded off.

24. An IC rod-magazine comprising an elongated tubular member having an inwardly directed wall protrusion and forming a magazine chamber having a substantially U-shaped interior cross-section, a deflectable spring element having one end mounted on said tubular member and a formation on the other end of said spring element, said formation including a wall section which, in the undeflected position of said spring element, extends across an opening at one end of said magazine chamber to block movement of IC elements from said chamber and in the deflected position of said spring element uncovers said opening to allow exit of IC elements from said chamber, said formation having a further wall section for receiving an externally applied force and causing deflection of said spring element, an IC separating plug-in portion which is slideable at said elongated tubular member and extends out from one end thereof, said separating plug-in portion being formed with an extraction opening which extends laterally of the longitudinal direction of the rod-magazine and the length of which, as measured in the longitudinal direction of the rod-magazine, is at least as great but no more than slightly greater than the length of the IC's contained in the rod-magazine, said separating plug-in portion including, at the end of its extraction opening, a stop for the IC's and further including a hand-operated deflecting element for the spring element, said deflecting element comprising a wire strap which extends in a rotatable manner cross-wise through the separating plug-in portion and having an outwardly bent portion which extends between the further wall section of the formation on said spring element and the bottom of the channel formed by the wall protrusion.

25. An IC rod-magazine comprising an elongated tubular member having an inwardly directed wall protrusion and forming a magazine chamber having a substantially U-shaped interior cross-section, a deflectable spring element having one end mounted on said tubular member and a formation on the other end of said spring element, said formation including a wall section which, in the undeflected position of said spring element, extends across an opening at one end of said magazine chamber to block movement of IC elements from said chamber and in the deflected position of said spring element uncovers said opening to allow exit of IC elements from said chamber, said formation having a further wall section for receiving an externally applied force and causing deflection of said spring element, an IC separating plug-in portion which is slideable at said elongated tubular member and extends out from one end thereof, said separating plug-in portion being formed with an extraction opening which extends laterally of the longitudinal direction of the rod-magazine and the length of which, as measured in the longitudinal direction of the rod-magazine, is at least as great but no more than slightly greater than the length of the IC's contained in the rod-magazine, said separating plug-in portion including, at the end of its extracting opening, a stop for the IC's and further including a hand operated defelecting element for the spring element, said separating plug-in portion having a tubular wall of substantially the same cross-sectional shape as, and press fitted over said elongated tubular member, said extraction opening being formed by a recess in said tubular wall substantially above the highest point of said inwardly directed wall protrusion and a through hole formed in a wall protrusion of said tubular wall corresponding to the wall protrusion of said tubular member through which said formation on the other end of said spring element projects, the case which carries the spring element and the separating plug-in portion being constructed in one piece.

* * * * *